(12) United States Patent
Jäger et al.

(10) Patent No.: US 8,554,358 B2
(45) Date of Patent: Oct. 8, 2013

(54) DEVICE FOR STORING SUBSTRATES

(75) Inventors: Erich Jäger, Frauenfeld (CH); Doris Jäger, legal representative, Frauenfeld (CH); Christian Balg, Tägerwilen (CH)

(73) Assignee: TEC-SEM AG, Tägerwilen (CH)

( * ) Notice: Subject to any disclaimer, the term of this patent is extended or adjusted under 35 U.S.C. 154(b) by 910 days.

(21) Appl. No.: 11/995,136

(22) PCT Filed: Jul. 6, 2006

(86) PCT No.: PCT/CH2006/000356
§ 371 (c)(1),
(2), (4) Date: Feb. 25, 2010

(87) PCT Pub. No.: WO2007/006166
PCT Pub. Date: Jan. 18, 2007

(65) Prior Publication Data
US 2010/0179681 A1    Jul. 15, 2010

(30) Foreign Application Priority Data
Jul. 9, 2005   (CH) ........................................ 1150/05

(51) Int. Cl.
*G06F 7/00* (2006.01)
*G01N 21/00* (2006.01)
*C01B 13/00* (2006.01)

(52) U.S. Cl.
USPC ........... 700/214; 700/213; 700/215; 700/216; 700/218; 211/41.18; 414/940; 250/559.29

(58) Field of Classification Search
None
See application file for complete search history.

(56) References Cited

U.S. PATENT DOCUMENTS

2005/0031531 A1* 2/2005 Stein et al. .................... 423/579
2006/0151404 A1* 7/2006 Blattner et al. ............ 211/41.18

FOREIGN PATENT DOCUMENTS

| JP | H04-239421 A | 8/1992 |
| JP | H07-285507 A | 10/1995 |
| WO | WO 2005/006407 | 1/2005 |
| WO | WO 2005006407 A1 * | 1/2005 |

* cited by examiner

*Primary Examiner* — Yolanda Jones
(74) *Attorney, Agent, or Firm* — McGlew and Tuttle, P.C.

(57) ABSTRACT

The invention relates to a device for storing platelike substrates, particularly wafers or test wafers, like those, in particular, used for manufacturing electronic components. The aim of the invention is to make a reliable access to the substrates possible even when storage elements, which can be separated from one another, of the device are affected by manufacturing mistakes. For such a device that, for each substrate, has a number of storage elements, which follow one another in a direction of stacking and which can move relative to one another, in which the storage elements have a stacking area, which is provided for placing the respective storage element inside a stack of storage elements, compensating means are therefore provided in order to compensate for stacking errors in the direction of stacking.

28 Claims, 13 Drawing Sheets

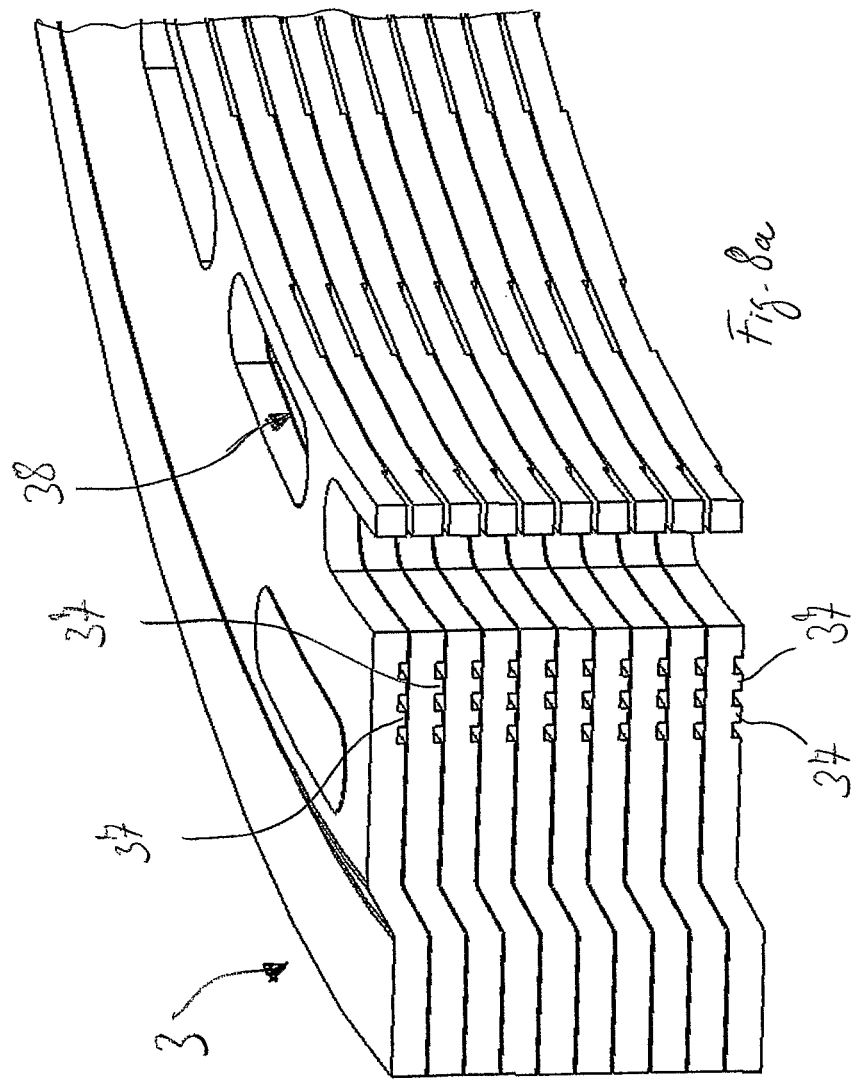

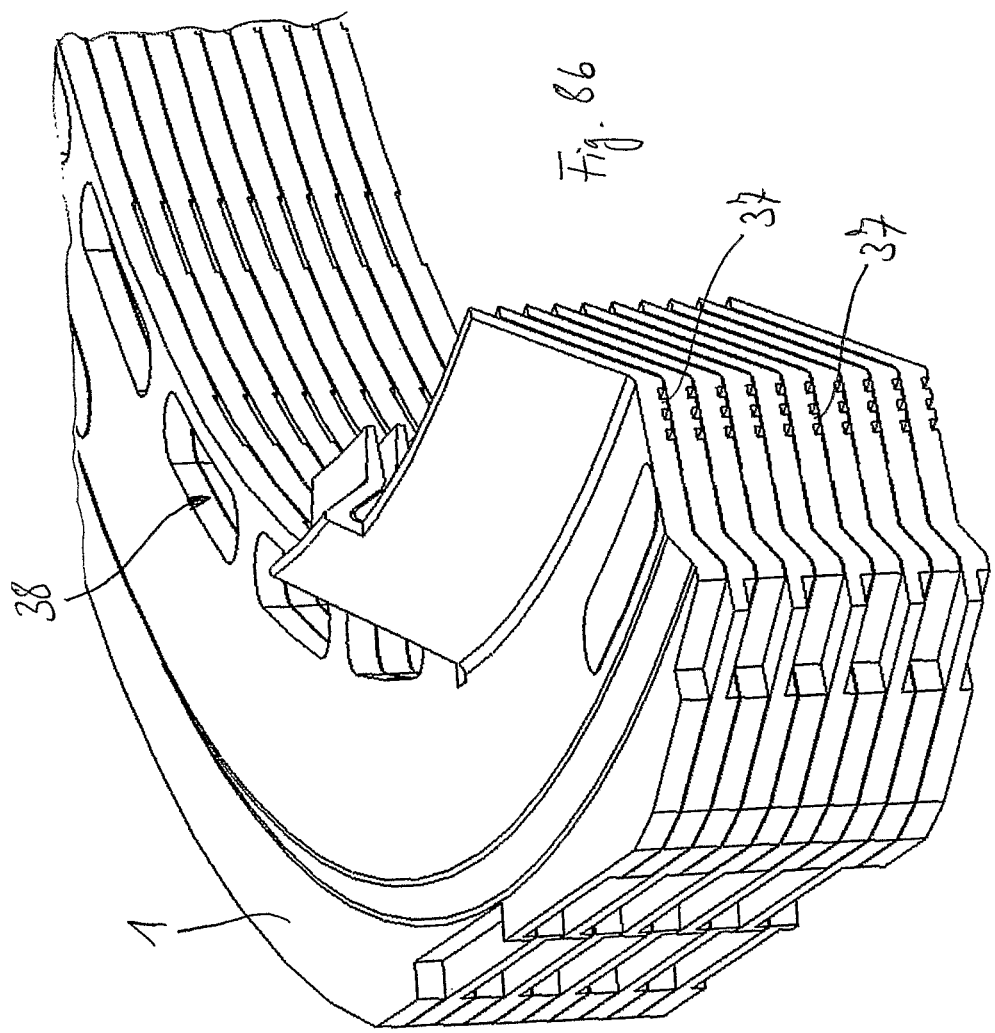

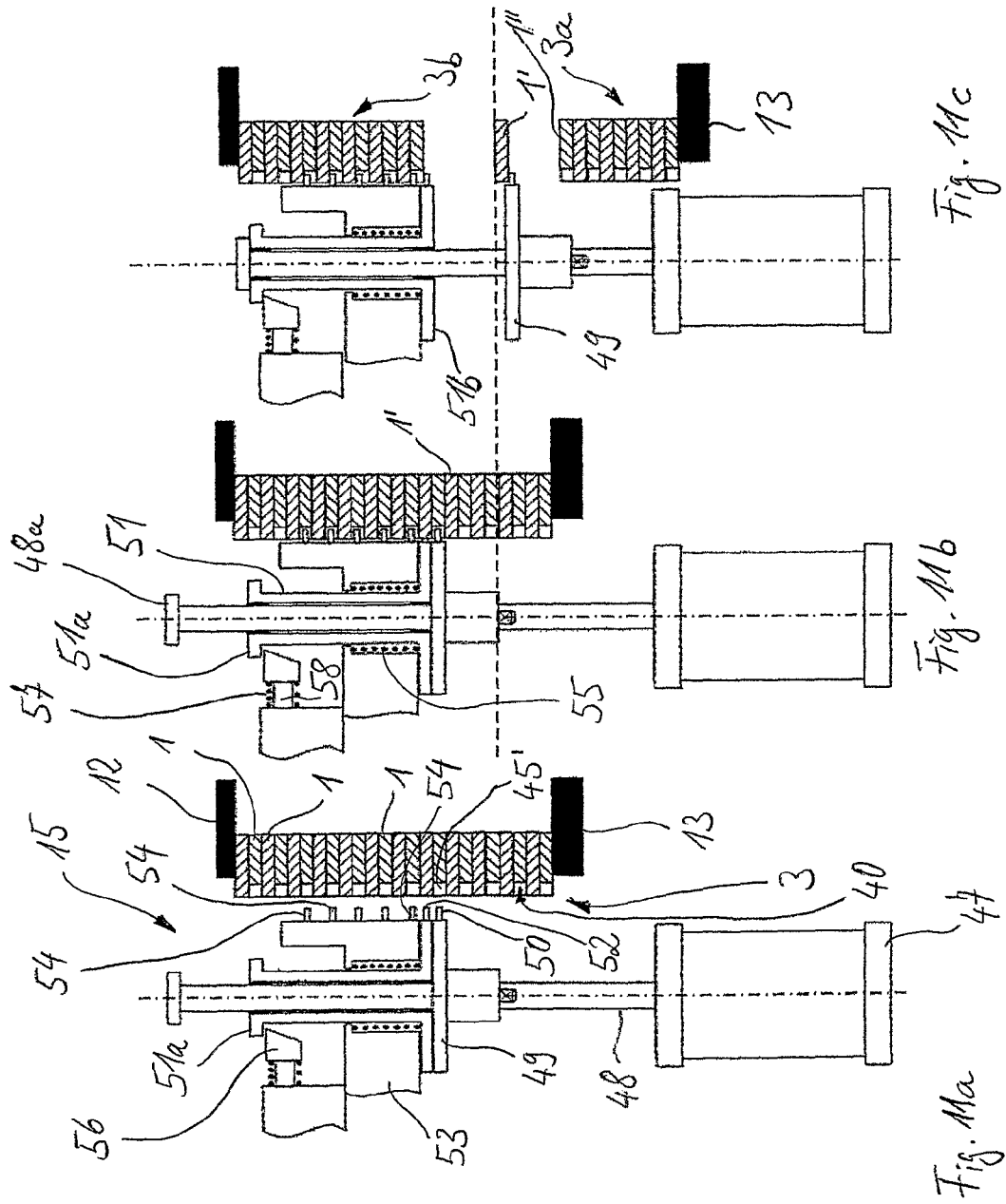

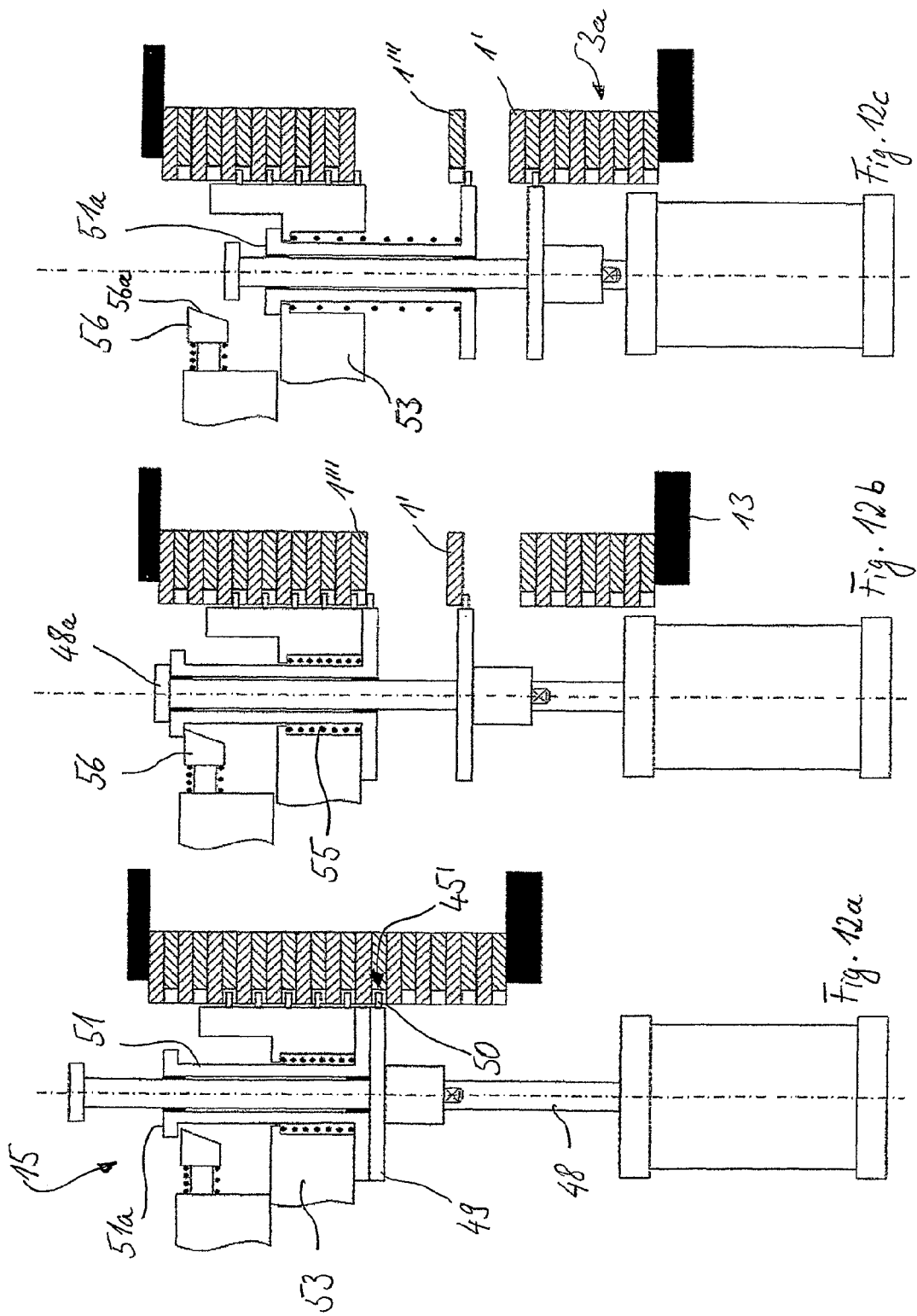

DEVICE FOR STORING SUBSTRATES

The invention relates to a device for storing substrates as is described in the preambles of claims 1 and 18. In addition, the invention relates to a method according to the preamble of claim 27.

Electronic components are usually produced from a plate-shaped substrate which is usually configured as an approximately circular semiconductor disk (wafer). These substrates must be supplied to various process installations in which the substrates are substantially surface-treated. Particularly in this context, it is frequently necessary to intermediately store the substrates if, for example, after completing one processing in a process installation, the substrates cannot be supplied immediately to another process installation. It is then usual for the substrates to be intermediately stored in a storage device under clean or ultra-clean room conditions. Since the costs for producing clean room conditions are substantially dependent on the size of the room, it is usually desirable to store the substrates with the shortest possible distance from one another.

Despite the shortest possible distance from one another, it is frequently desirable to remove only individual wafers from the storage device. Thus, a storage device as described in WO 2005/006407 A1 has already been proposed so that it is possible to remove individual predetermined wafers despite the very short storage distance between successive wafers. This storage device comprises individual storage elements which can be stacked one upon the other which are provided with elevated supports compared with their stacking area on which respectively one wafer can be arranged. A following storage element is disposed on the stacking area of the preceding storage element. The wafers hereby come to lie with their surfaces in a stack of such storage elements with a very small distance from one another. In order to either remove a wafer from a particular storage element or to place a wafer on the storage element, a relative movement is executed between the stack and an opening means to locate the opening means at a particular position of the stack. The opening means then grips on one or more storage elements in order to increase the distance between the distance between two storage elements immediately following one another in the stacking direction. This then allows access to the area of the storage element on which a wafer is stored or is to be stored.

In order to be able to form a stack at all which does not immediately tip or slide despite a large number of storage elements, the storage elements from WO 2005/006407 A1 have centring domes as stacking aids. The centring domes of superposed storage elements engage with one another and thereby impart stability to the stack. It has been shown that particularly in a large stack of storage elements, this solution imposes high requirements on the production accuracy of the storage elements despite the stacking aid. In particular, production inaccuracies relating to the stacking area of the respective storage element or the stacking aid itself can add up to a considerable displacement of the actual positions compared to the desired positions of the storage elements in the stack in the case of successive storage elements. If such production inaccuracies always occur at the same place in a plurality of storage elements, this can lead to considerable instability of the storage stack and in the worst case, it can lead to tipping.

It is therefore the object of the invention to make a contribution to the ability to access storage elements in a stack of storage elements which can be moved relative to one another and in particular can be separated from one another when these are beset with production inaccuracies or for some other reason, their actual positions deviate from their desired positions in the stack of storage elements.

This object is achieved according to the invention in a device of the type specified initially by a compensation measure to compensate for stacking errors. The compensation according to the invention can be used in particular for positioning as exactly as possible an opening or access means relative to the storage element in the stack which is to be accessed for placement or removal. The compensation measure can in particular lead to the correction of stacking errors caused by production errors as a result of which the stack deviates from the provided stacking axis. Preferably, however, the compensation measures compensate for errors which lead to a deviation of the actual position of a particular storage element in the stack from its desired position in the stacking direction i.e. along the desired stacking axis. Particularly preferred are compensation measures which can compensated for both types of stacking errors.

Such compensating means according to the invention can, for example, comprise storage elements arranged rotationally offset with respect to one another in relation to their circumferential direction, it has been shown that production inaccuracies are frequently attributed to systematic errors in production, for example, as a result of an inaccuracy of an injection mould used to produce substantially always the same storage elements, at least in their stacking area. However, systematic production inaccuracies can also occur for other reasons, for example, as a result of process errors, in particular because of unsuitable process parameters.

It was recognised within the scope of the invention that these errors can be compensated by arranging storage elements which can be separated from one another, rotationally offset with respect to one another, whereby the production inaccuracy can preferably be distributed uniformly over the circumference of the stack. This applies particularly when using at least substantially the same storage elements to form at least one part of a stack. If several storage elements are arranged offset with respect to one another starting from a first storage element, the production inaccuracy in relation to a tendency of the stacked storage elements to slope can be compensated for that storage element which again has the same rotational position as said first storage element. The other storage elements of the respective stack can preferably be arranged according to the same principle. Since the storage elements are therefore arranged significantly closer to their desired position, the positioning accuracy of opening means on the stack whereby the stack is opened for access to substrates can be improved by the measure according to the invention. In addition, the tendency to tipping which is otherwise to be feared with such storage towers can be significantly reduced by means of the invention.

The compensation according to the invention can be achieved by an offset of successive storage elements of respectively 180°. Stable stacks with compensated production errors can also be achieved with different rotational offsets of the storage elements which are always the same amount, for example 90° in each case.

Naturally dissimilar rotational offsets within 360° are also possible. Production in accuracies can also be compensated after a rotational offset of more than 360°. For example, six successive storage elements can be offset with respect to one another by 180°-90°-180°-90°-180°. It is likewise feasible for seven successive storage elements to be offset with respect to one another by the angles 120°-90°-180°-120°-90°-120°. Other storage elements can preferably also be arranged according to respectively the same pattern, where this information is only to be understood as examples for a plurality of possibilities.

In order to achieve a safe arrangement of storage elements in the stack, the storage elements can be provided with stacking aids. Such a stacking aid can, for example, be an interlocking element disposed on one storage element which engages in an element complementary to the interlocking element on a following storage ring. A pin or dome, for example, which engages in a cavity or a recess adapted in shape and size can be provided as an interlocking element. The arrangement of positions of the stacking aids on the storage element are advantageously adapted to the provided offset of the storage elements about the stacking axis. Production inaccuracies in the area of the stacking aids can be compensated with the compensating means provided according to the invention so that there is no tendency to tipping and access can safely gained to particular storage elements in the stack.

According to a further aspect of the invention which also has independent importance, the device can have at least one opening means whereby a distance between two storage elements arranged in a stack of storage elements can be varied, in particular can be enlarged, the device can additionally provided with at least one detection means whereby information on positions of individual storage elements in the stack can be determined, the device is further provided with a controller to which the position information can be supplied and which, taking into account the position information, can generate control signals by which means the opening means and the stack can be moved relative to one another and positioned relative to one another in a desired position.

This solution can be provided alternatively or additionally to the measure according to the characterising part of claim 1. In particular, by detecting the actual position of storage elements in the stack, it is possible to achieve a correctly situated positioning of the opening means in relation to the stack in the event of deviations from a desired position. The opening means can thereby be positioned in each case at the position required for access to a particular storage element relative to the stack. Positioning errors of storage elements caused by production inaccuracies or other reasons can thereby be reliably compensated.

In a further preferred embodiment of the invention, the opening means can be provided with at least two opening devices which are offset with respect to one another in the circumferential direction of the stack, preferably located at least approximately diametrically opposite to one another in relation to the stack. With the invention, it is now possible to bring the opening elements independently of one another into a favourable relative position for opening the stack to access a predetermined storage element. For this purpose, any of the opening elements can be displaced with the involvement of control signals based on detection signals of the detection means assigned to the respective opening element. In a preferred embodiment, a coarse positioning of the opening elements can take place initially, whereby a common relative displacement movement of the opening elements takes place with respect to the track. Fine positioning of the opening elements can then be achieved as a result of the relative displaceability of the opening elements independently of one another.

In a preferred embodiment, the stack can be displaced in the direction of the stack axis. This scope for movement can preferably be used for coarse positioning of the storage elements with respect to the preferably two opening means.

It can furthermore be provided that at least one opening means is likewise displaceable, preferably also in the direction of the stacking axis. The displaceability of the opening means can be used for exact positioning of the opening means with respect to the storage element which is to be accessed.

The object is additionally achieved by a method according to claim 27 or 28.

A further aspect of the invention which can also have independent importance is concerned with how the storage objects arranged in a stack of separable storage elements can be protected from contamination, particularly with dust particles. In order to achieve this in a device according to the preamble of claim 18, means for introducing a medium into the stack and gas conducting means can be provided.

In a preferred embodiment, the gas conducting means can contain a channel formed in the stack through which the medium specifically flows into an area provided for the placement of substrates. Thus, clean room conditions can be created in a particularly advantageous manner in the interior of the stack. In this connection, one embodiment of the storage elements can be provided in which the storage elements initially have at least one seal for a gaseous medium in relation to a direction from outside onto a central area. At a short distance from the central area of the wafer compared to this, at least one gas conducting element should be provided whereby a supplied gaseous medium can be guided inside a stack formed by several storage elements in an at least approximately predetermined manner. The at least one gas conducting element should therefore be provided to predetermine a direction of flow of the medium in at least one part of the stack. In a preferred further development, a storage element according to the invention can have at least one centring and/or stacking aid which is at a greater distance from the central area of the storage element or the stacking axis compared to the gas conducting element and preferably than the seal.

This solution allows several functions to be realised despite the very constricted spatial relationships in such a stack. Thus, the storage elements can be safely stacked without the stacking aids provided for this purpose being able to decisively hinder any gas stream directed in a predetermined manner via the wafers. In addition, the gas flow can be guided through the stack merely with the storage elements and additional gas conducting elements are not absolutely necessary for this. Particles which could be deposited on the surface of the stored wafers and could thereby result in waste during the production of electronic components, can be removed from the stack with the gaseous medium.

In a preferred further development, recesses can be provided in the storage elements as gas conducting elements where a channel-like arrangement is formed by recesses of several storage elements. This channel-like arrangement can be used to guide the gaseous medium introduced into the stack at one or more locations through the stack and emerge at suitable locations in the direction of the wafer surfaces.

The seal can preferably be achieved by forming at least one sealing lip on the underside and/or upper side of each storage ring. In this case, the sealing lips can extend in the area of the gas conducting elements along at least one circumferential section of the storage rings to prevent any escape of the gaseous medium from the stack at this location. The sealing effect can be achieved in particular by the corresponding sealing lip abutting against an adjacent storage ring, thus producing a barrier for the gas flow between respectively two storage elements. In a preferred embodiment of the invention, several sealing lips can be provided between two storage elements, which together produce a seal in the form of a labyrinth seal.

Further preferred embodiments of the invention are obtained from the claims, the description and the drawings.

The invention is explained in detail with reference to exemplary embodiments shown schematically in the figures, where the figures show:

FIG. 1 a device for storing wafers comprising a stack of storage rings in a perspective view;

FIG. 8a is a perspective sectional view of a stack of storage rings according to FIGS. 4 to 7;

FIG. 8b is a further perspective sectional view of a stack of storage rings according to FIGS. 4 to 7;

Figure 9:
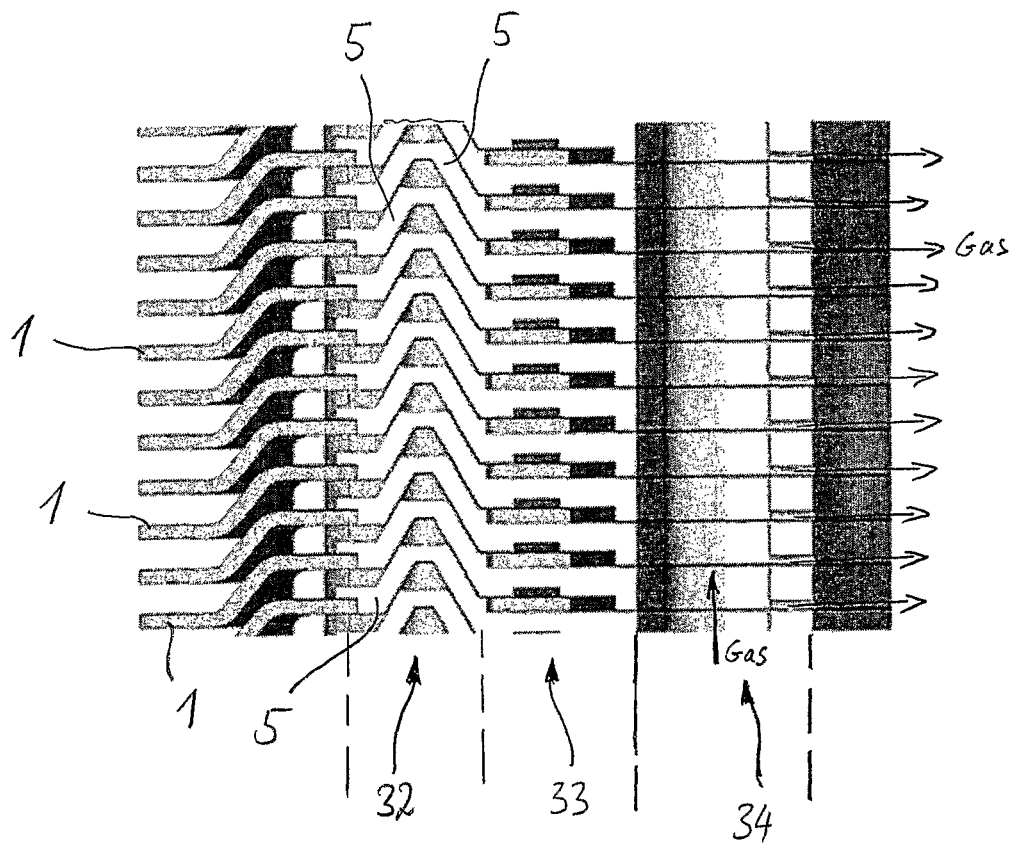
FIG. 9 is a schematic partial sectional view through a stack of storage rings.
Figure 10:
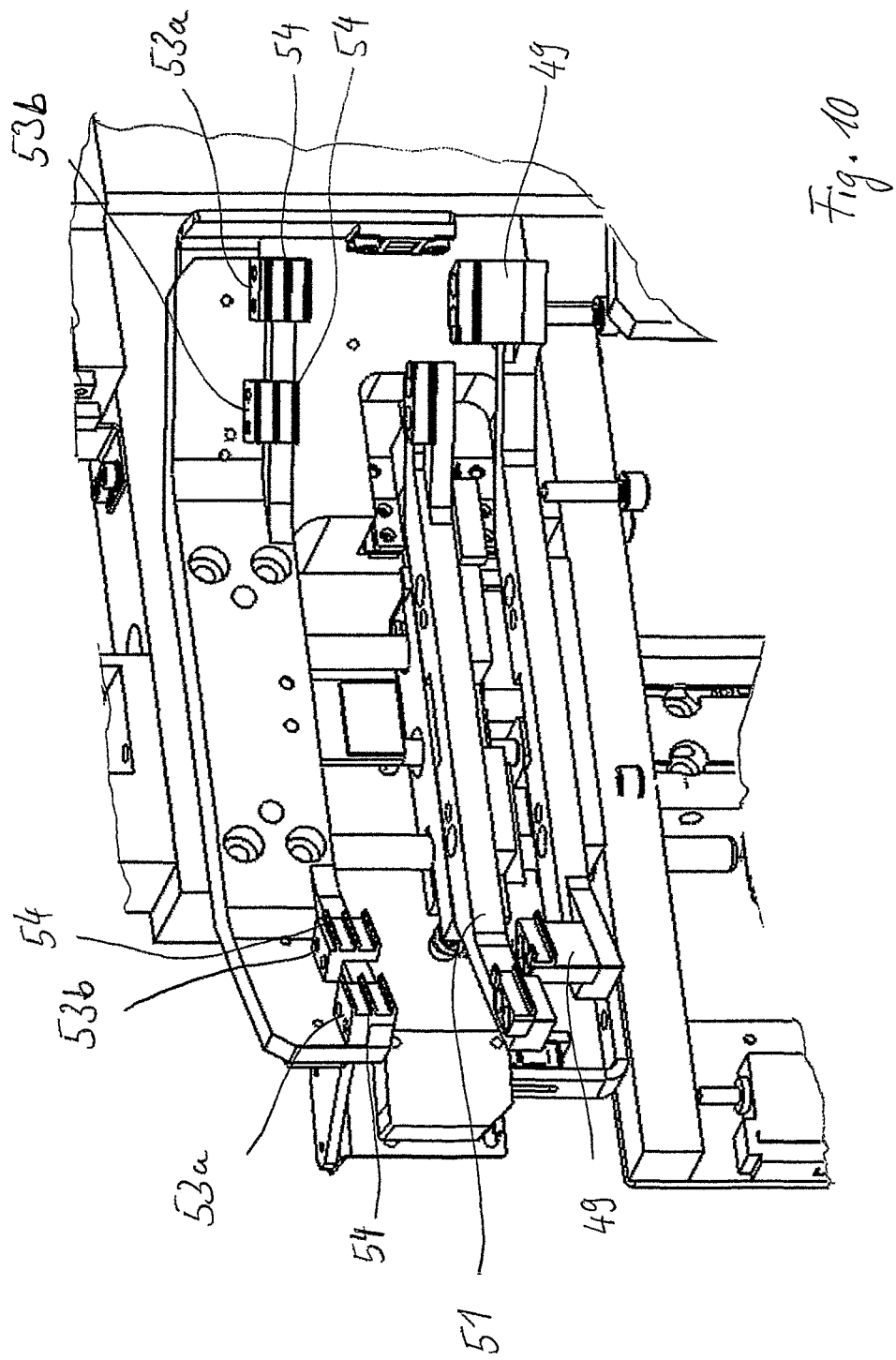
FIG. 10 is a perspective view of an opening device.

FIG. 11a-c is a diagram of process steps for opening a stack formed with the storage rings from FIGS. 4 to 10 with an opening device from FIG. 10;

FIG. 12a-c is another diagram of process steps for opening a stack formed with the storage rings from FIGS. 4 to 10.

Figure 1:
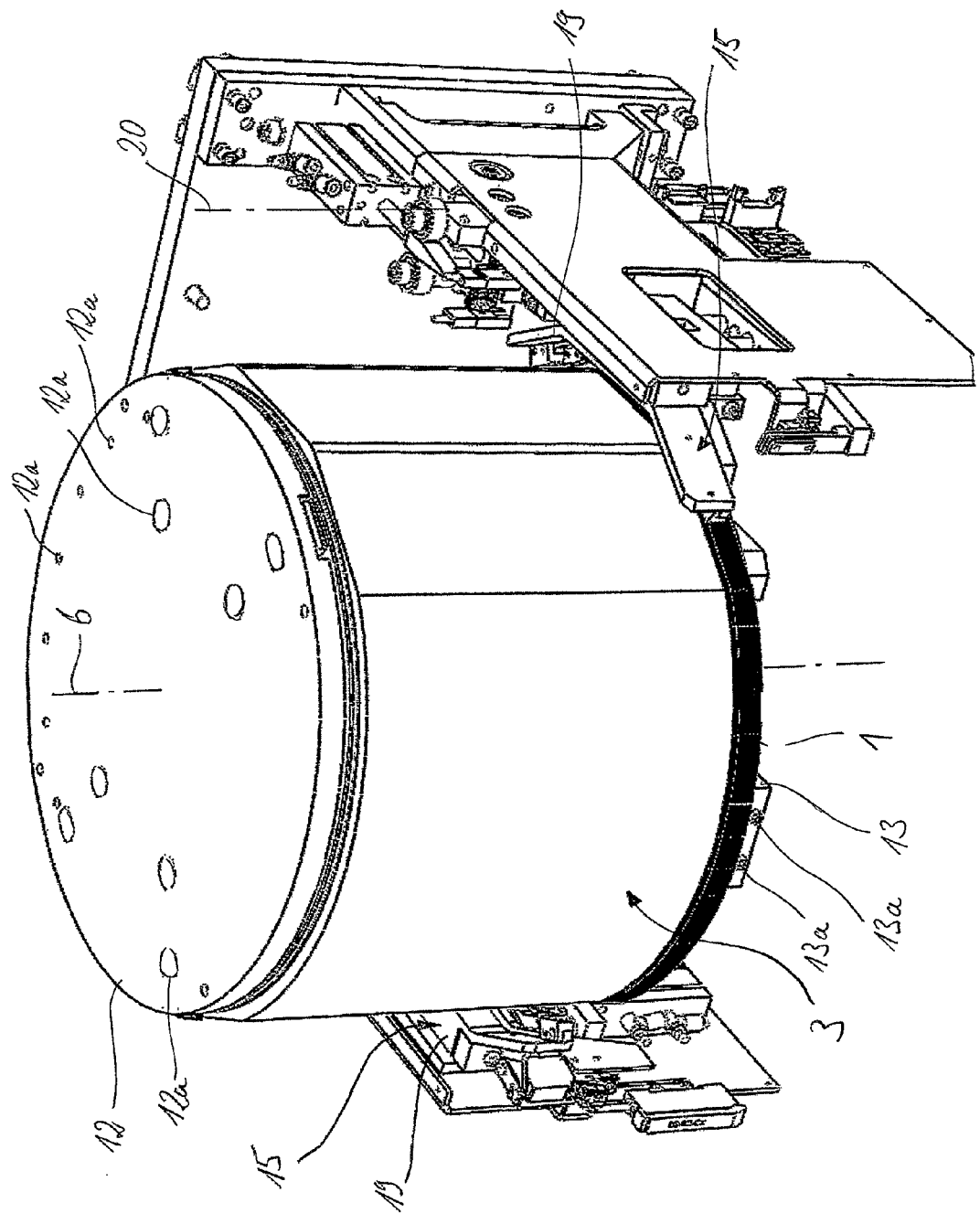
Figure 3:
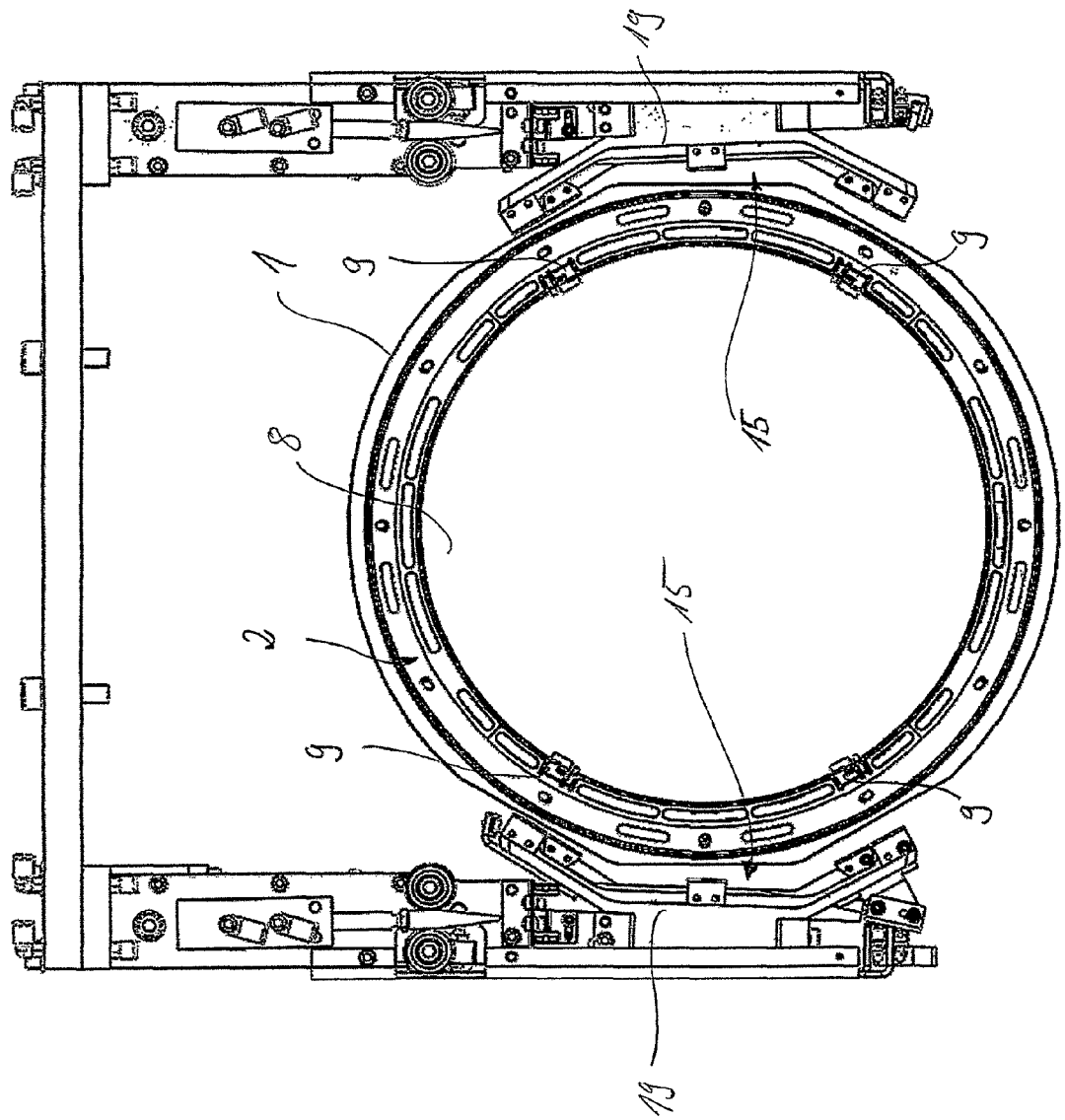
FIG. 3 is a top view of the device according to the diagram in FIG. 1 and FIG. 2.
Figure 4:
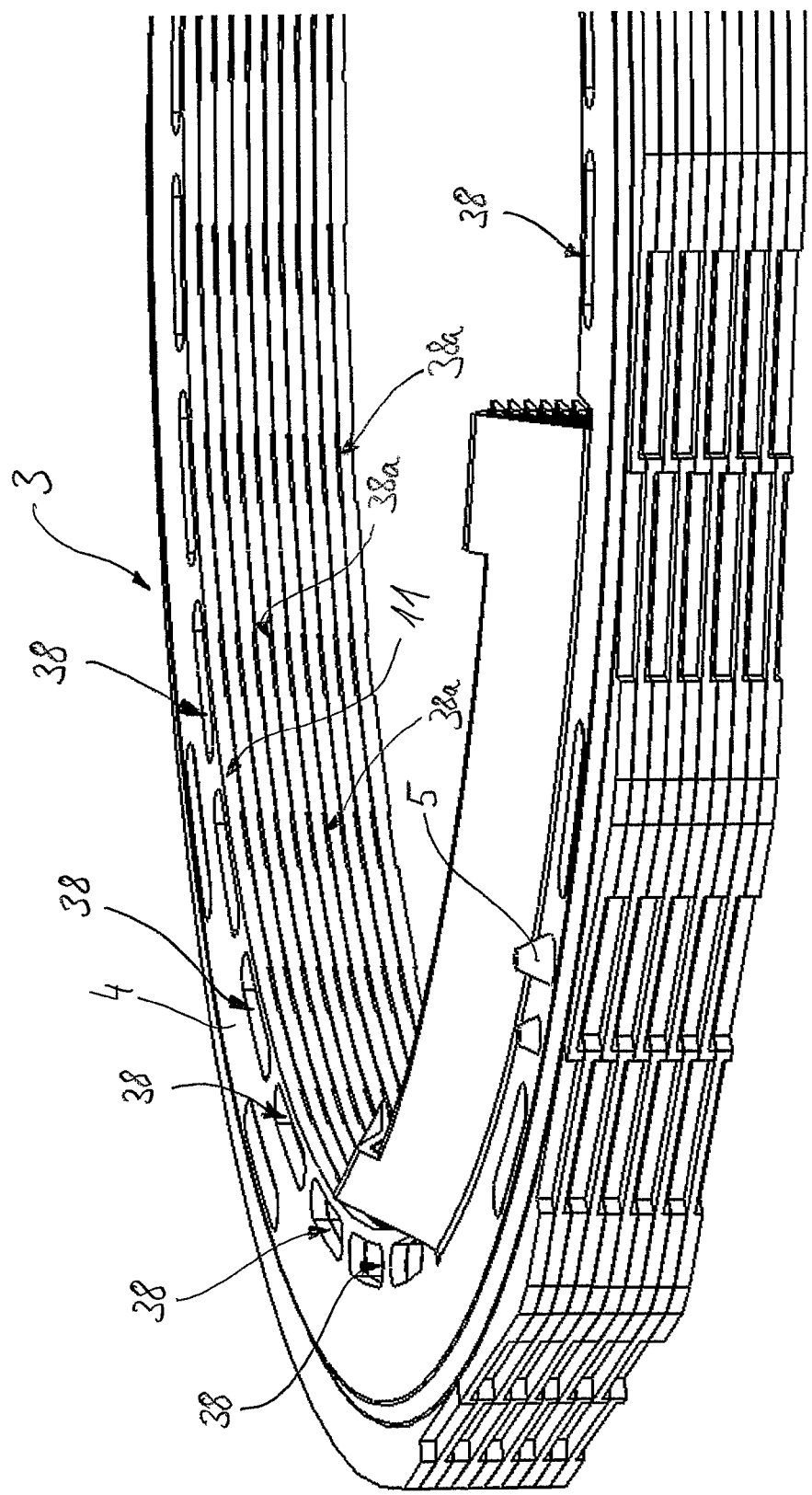
FIG. 4 is a perspective partial view of several storage elements stacked one upon the other which are configured according to a further embodiment of the invention.

The invention relates to storage elements and their handling as has already been described in principle in WO 2005/006407. The contents of WO 2005/006407 are consequently hereby completely incorporated by reference. The storage elements shown inter alia in FIG. 3 are configured as storage rings 1 and have a stacking area 2 with which they can be arranged for storage in a stack of storage elements. Such a stack 3 is also shown in FIG. 1, wherein only the lower storage rings 1 of the stack 3 are shown here. The other storage rings are merely shown in the form of the contour of the stack produced by the storage rings.

Figure 2:
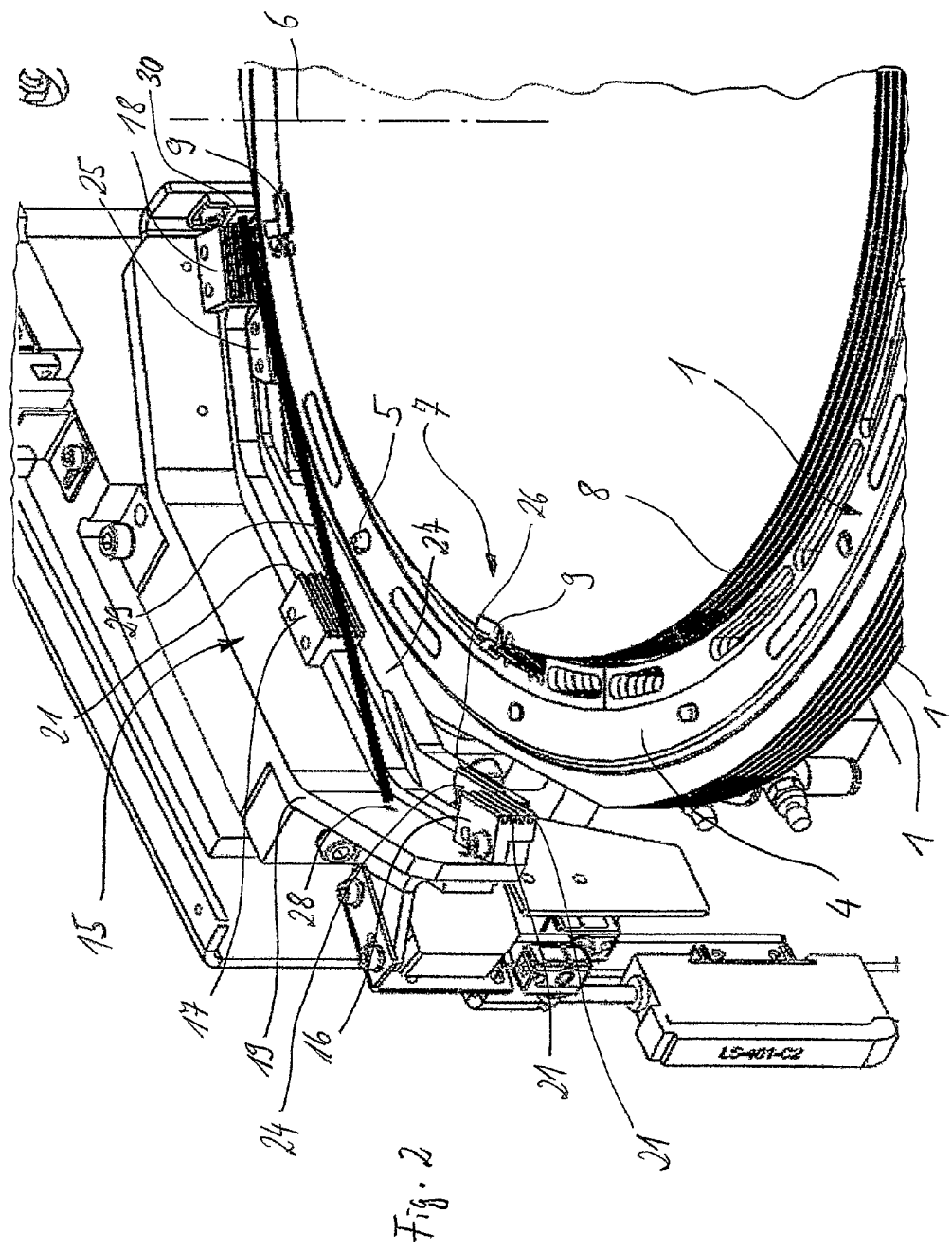
FIG. 2 is a section from FIG. 1, showing only part of the stack.

As shown in FIG. 2 inter alia, in the exemplary embodiment of the storage elements shown here, a ring part 4 of the storage elements is provided as the stacking area 2 with which the storage elements lie one on top of the other. Apart from the uppermost and the lowermost storage ring of the stack from FIG. 1, each storage ring thus lies on the storage ring 1 located respectively below it in the stack. Likewise, the following storage ring above it in the stack is located on its stacking area. Contact with the neighbouring storage rings is always made with the ring part 4 of the storage rings 1.

As a stacking aid, each storage ring has on its ring part 4 at least two dome-like, centring elements 5 projecting from the ring part 4 whereby exact stacking of the storage rings 1 can be achieved along a stacking axis 6. The two centring elements of each storage ring are each offset by respectively 180° with respect to one another. In addition, the centring rings 5 of successive storage rings can be stacked into one another whereby the storage rings can be stacked one upon the other closely spaced but nevertheless exactly aligned (centred) with respect to the stacking axis In the stacked state the storage rings thus lie approximately one upon the other whereby access to a storage area 7 of the storage elements for the removal or insertion of a wafer 8 is not easily possible.

In addition, each of the storage rings having an identical structure has four holding elements 9 in the storage area 7, these being provided to receive respectively one wafer 8 per storage ring. Starting from the ring part 4, the holding elements 9 comprise a first section 9a which runs obliquely upwards and towards the centre of the ring part, and this is adjoined by a second section 9b which has a substantially flat and slightly downwardly inclined bearing surface 10 (e.g. FIG. 5). The wafers 8 are provided for arrangement on the bearing surfaces 10 of the holding elements 9.

As a result of production-technology inaccuracies, for example of an injection mould usually used to produce the storage rings 1, all the storage rings can, for example, have an increased thickness of the ring part always at the same location. Another possible repeatable error can be a deviation from the desired flatness (unevenness) and similar. In order to compensate for such errors which always occur at the same location of the storage elements, successive storage elements in the stack can be arranged offset with respect to one another by a certain angle of rotation.

In the exemplary embodiment in FIGS. 1-4, the angle of rotation is 180° about the linear stacking axis 6 along which the storage elements are stacked one on the other. Thus, the locations having a specific production inaccuracy are also offset from successive storage elements by 180°. Without this offset, the production inaccuracies of the storage elements would be continuously added at the same angular position of the stack on one side. This could lead to significant sloping of the tower or stack 3. As a result of the measure according to the invention, the inaccuracies are uniformly distributed on diametrically opposite sides of the stack 3, thus preventing a one-sided sloping of the stack. This applies even if the storage elements should have several systematically occurring production inaccuracies.

In the diagram in FIG. 1, a cover plate 12 is placed on the stack 3 of storage rings. The stack 3 is located together with the cover plate on a base plate 13 which is provided with connections 13a for air, nitrogen and another gas. By means of these connections, a gas supply can be connected via the base plate 13 to produce an approximately closed atmosphere in the stack 3.

The base plate 13 is connected in a manner not shown to a linearly displaceable Z axis whereby the stack 3 can be raised and lowered vertically along the stacking axis 6. The Z axis has a servo drive from Lust Antriebstechnik GmbH and a linear movement axle from HSB Antriebstechnik GmbH, Reutlingen. The linear movement axle additionally has a recirculating ball screw driven by the servo drive which is connected to a carriage which in turn is disposed on a profile rail aligned parallel to the Z axis. A supervisory SPS controller from Eckelmann AG controls the movements of the Z axle and the movements of other axles of the device.

The device is further provided with opening means whereby the distance from respectively one pre-determinable storage ring 1 to adjacent storage rings 1 can be enlarged to allow access to the respective storage ring 1. As can be seen in particular from FIG. 3, the opening means comprises two diametrically opposite opening devices 15 in relation to the stack. From the diagram of one of the opening devices 15 in FIG. 2 it can be deduced that each of the opening devices is provided with three spaced-apart holding elements 16, 17, 18. The holding elements 16-18 of each opening device 15 are rigidly arranged on respectively one support 19 of the respective opening device 15. The two supports 19 are each pivotally arranged about their pivot axis 20, both pivot axes 20 running parallel to the stacking axis 6. The holding devices 16-18 are located at the same height in relation to the stacking axis 6, are identically formed and each have a plurality of grooves 21 running parallel to one another, their width being insignificantly greater than the height of the ring part 4 of the storage rings. The centre-to-centre distances of the grooves 21 of each holding element 16-18 correspond to the centre-to-centre distances of successive storage rings in the stack.

A separating element 24, 25 is located between the middle holding element 17 and the two outer holding elements 16, 18, in each case immediately adjacent to the two outer holding elements 16, 18. The separating elements 24, 25 each have a groove 26 which both run parallel to the grooves 21 of the holding elements 16-18. Both separating elements 24, 25 of each opening device 15 are disposed on respectively one carriage 27 which is linearly displaceable parallel to the stacking axis 6. The two carriages 27 are in turn located on respectively one rail (not shown in detail) which is affixed to respectively one of the two pivotable supports 19. The separating elements 24, 25 are thus pivotable and displaceable relative to the holding elements 16-18.

In addition, an optical sensor is attached to each of the two supports 19 of the holding elements 16-18, for example, a light barrier with a light transmitter 28 (laser or the like) from which the light beam is directed onto a light receiver 30. As can be seen from FIG. 2 in particular, the light beam 29 is aligned in this case so that this is interrupted by the circumferential region of a storage ring 1 if such a storage ring of the stack 3 is located at the height of the optical sensor. Since the storage rings 1 in the stacked state at least have a short distance from one another in their circumferential region, the light beam 29 is not interrupted when this is located between two storage rings relative to the stack 3.

In one of many possible methods of access to a storage ring which can be used with this device, an initialising teaching process is carried out in a first step. In this case, starting from a reference position of the base plate 13 along the stacking axis 6, the entire stack 3 is passed by the light barrier at constant speed by means of a vertical displacement movement of the base plate 13. As a result of the function distance=speed*time, the controller stores a distance value as well as the number of the relevant storage ring in a table compiled by the controller for each interruption of the light barrier. This distance value corresponds to the distance of the respective storage ring 1 from the base plate 13.

If a particular storage ring 1 is then to be accessed, the distance value pertaining to the corresponding storage ring is read out from the data table. The controller then causes the base plate 13 to be moved in relation to the reference position by the position corresponding to the distance value. As soon as the storage ring 1 to be exposed for access is located at the same height as the separating elements 24, 25 in relation to the stacking axis 6, the supports 19 pivot synchronously, but in counter-rotating movements about their respective pivot axis 20 on the stack 3. By this means, on the one hand, the storage ring to be exposed is received in the grooves 26 of the separating elements 24, 25. On the other hand, the four storage rings located immediately above this storage ring are disposed in the respectively four grooves 21 of each holding element 16-18.

The base plate 13 is now lowered by a specific distance. In this case, the separating elements 24, 25 travel downwards with the storage ring to be exposed but by a smaller distance than the base plate. In this case, the movement of the separating elements 24, 25 can take place merely as a result of their weight and the weight of the carriage 27. Likewise, it is also possible to execute or assist this movement by tracking by means of a pneumatic cylinder or by the force of a spring. As a result of these movements, on the one hand a distance of predetermined magnitude is created between the storage ring 1 to be exposed and the next storage ring upwards in the stacking direction. In addition, the distance from the immediately following storage ring downwards in the stack is also increased by a predetermined value.

It is hereby possible to travel with a gripper (not shown in detail) between the wafer 8 of the now exposed storage ring 1 and the wafer 8 which is located on the next storage ring 1 downwards in the stack. The desired wafer 8 can then be raised in the direction of the next upward storage ring and removed. In this way, but in the reverse sequence, a wafer can also be positioned on a storage ring thus exposed. By raising the base plate 13 by the distance covered downwards for the lowering, the stack is closed again. The support 19 can then be pivoted away from the stack 3 again so that the latter can be displaced as a whole back in the direction of the stacking axis 6, for example, into the reference position.

For any access to a predetermined storage ring 1, an alternative method hereto can provide to determine by means of the sensor, the position of the respective storage ring to be made available in the stack, for example, in relation to the base plate 13. As a result of this detection, the stack can be positioned in front of the opening means. The actual opening process of the stack can take place in the manner already described. In order to determine a specific storage ring in the stack, it is merely necessary for the controller to count the number of interruptions corresponding to the position of the corresponding storage ring in the stack. If the sensor is located in the Z direction at the same height as the separating elements 24, 25, at the time of the last interruption of the light beam 29 the separating elements 24, 25 are already at the same Z position as the storage ring to be made available. Otherwise, the controller must take into account the distance in the Z direction between the sensor and the separating elements 24, 25 for a corresponding tracking of the separating elements.

As a result of the detection process which is always required, this embodiment of the method according to the invention is presumably slightly slower than the embodiment described first. This embodiment is particularly advantageous however, because of its high accuracy since any access takes place on the basis of current detection results determined immediately beforehand.

A further embodiment according to the invention which can be combined with any of the aforesaid embodiments can provide that detection means for determining the position of the storage rings are provided on both supports 19 or are assigned to both supports. Sensors such as those already described, for example, can be used as detection means. With this solution, the access positions for the opening devices 15 can be detected on both sides of the stack. The position information of the detection means on both sides can then be used by the controller to position the opening device 15 assigned to the respective detection means independently of the other opening device. For this purpose the opening devices can be pre-positioned by a displacement movement of the stack 3 in the vertical direction relative to the stack. An exact positioning can then be made by a displacement movement of the separating elements 24, 25 from one or both sides, where the separating elements of the two opening devices can be moved independently of one another.

FIGS. 4 to 12 show another exemplary embodiment in which fundamentally the same elements in relation to the exemplary embodiment of FIGS. 1 to 3 are provided with identical reference numerals. Here also identical storage rings 1 stacked one upon the other are provided wherein the distance between successive storage rings 1 can be varied. In the area of an inner circumferential surface 11 of the ring part 4, each of the storage rings 1 has a plurality of oblong-hole shaped recesses 35. In this case, the recesses 35 of one storage ring are configured as mirror-symmetrical with reference to at least one diameter line 36. These imaginary diameter lines also intersect the stack axis which can in turn be seen as a rectilinear connection of the centre points of the circular wafer surfaces if all the wafers in the stack are in their desired position.

As can be seen in particular from FIGS. 8a and 8b, on their underside the storage rings have webs 37 in the area of the channel-like recesses. These webs 37 are located in relation to the stacking axis at a shorter distance from the stacking axis than the centring dome 5 but they have a greater distance from the stacking axis than the recesses 35. In other embodiments the webs can be provided on the upper side of the storage rings or both on the upper side and on the lower side in each storage ring.

In a stack 3 storage rings 1 arranged one upon the other hereby form with their channel-like recesses 35 a plurality of channels 38 running parallel to the stacking axis and running around the wafers. In addition, the webs 37 abut against the upper side of the respectively next storage ring downwards. As a result, two storage rings 1 stacked one upon the other each form a sealing running around the entire circumference, in particular a labyrinth seal. In other exemplary embodiments in which the storage rings are provided with webs both on the lower side and on the upper side, in order to form a seal respectively one web 37 on the upper side of a storage ring located immediately thereunder can engage between two webs 37 on the underside of one storage ring.

FIG. 9 shows a partial view of a section through a stack which thus forms a region 32 of centring elements 5 in the stack. An adjacently arranged sealing region 33 then follows in the direction of the stacking axis and this is finally followed by a channel region 34 in the direction of the stacking axis.

A gaseous medium such as, for example, nitrogen can be fed into the channels 38 from below via a connection 13a provided on the base plate 13 (as shown for example in FIG. 1). The medium can then ascend in the channels 38. The medium is preferably only fed into channels on one side of the stack, for example, via a circumferential section from a region of about 70° to 180°, preferably from 90° to 120°. In other embodiments the medium can also be supplied at a different position in the stack.

Gaps 38a are formed in the area of the inner circumferential surface as a result of locations having a reduced thickness of the delimiting sections of the recesses 35. The pressurised medium flows through this gap 38a between respectively superposed storage rings out from the channels 38. Since pressure differences prevail as a result of the supply of the medium, the medium flows via the surfaces of the wafers 8 from this outlet side in the stack over the surfaces of the wafer onto an opposite discharge side. The medium can then enter into the channels located on this side and pass out of the stack via recesses 12a in the cover plate 12 (see FIG. 1). This predetermined flushing direction of the medium inside the stack 3 can be further assisted by a suction device. This can be located in particular in the area of the cover plate 12 on the discharge side of the stack to remove the medium from the stack at this point.

Particles located in the stack in the area of the wafers can be removed with the medium. The medium thus makes it possible to produce clean room or ultraclean room conditions inside the stack.

Figure 5:
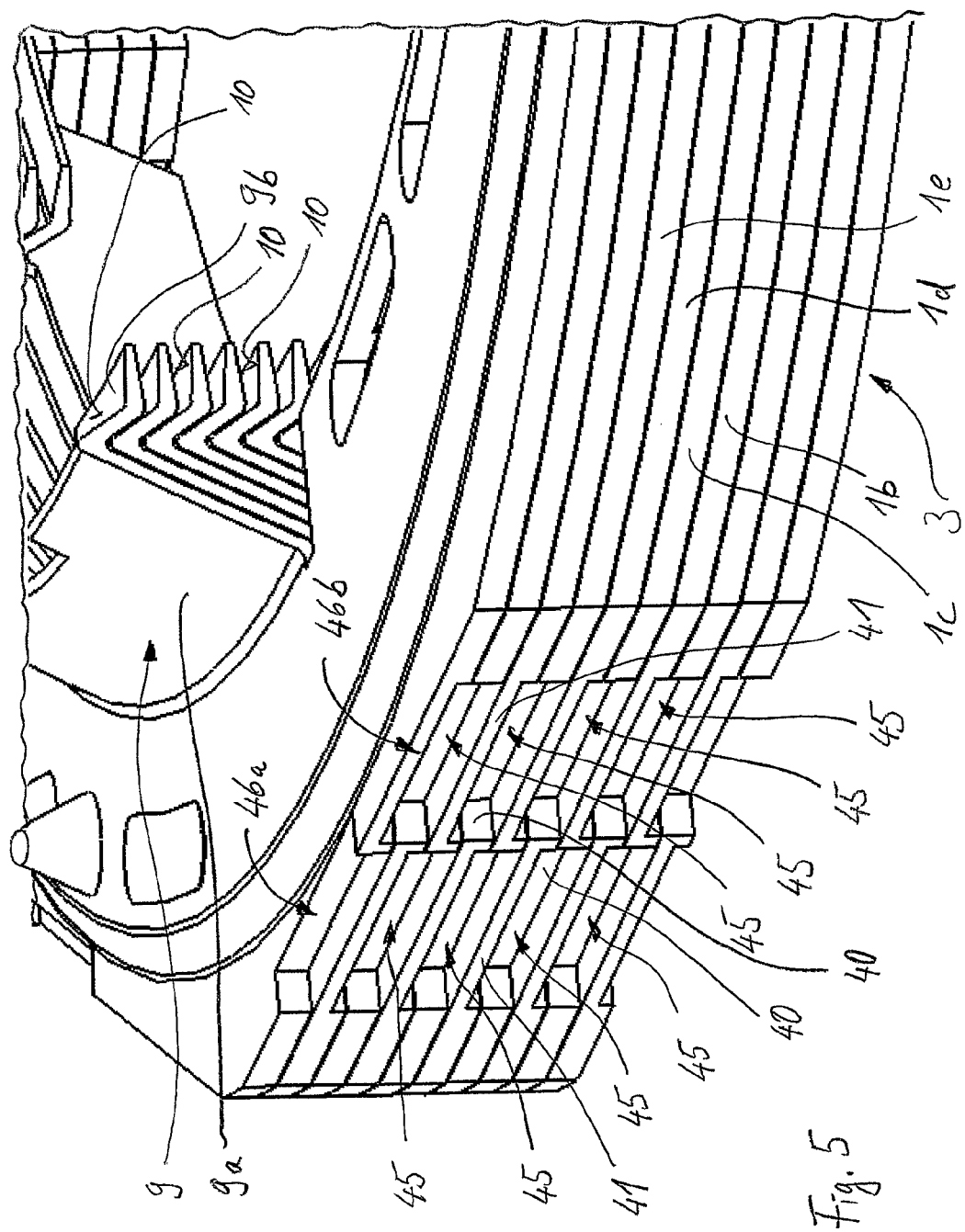
FIG. 5 is a section from FIG. 4.
Figure 6:
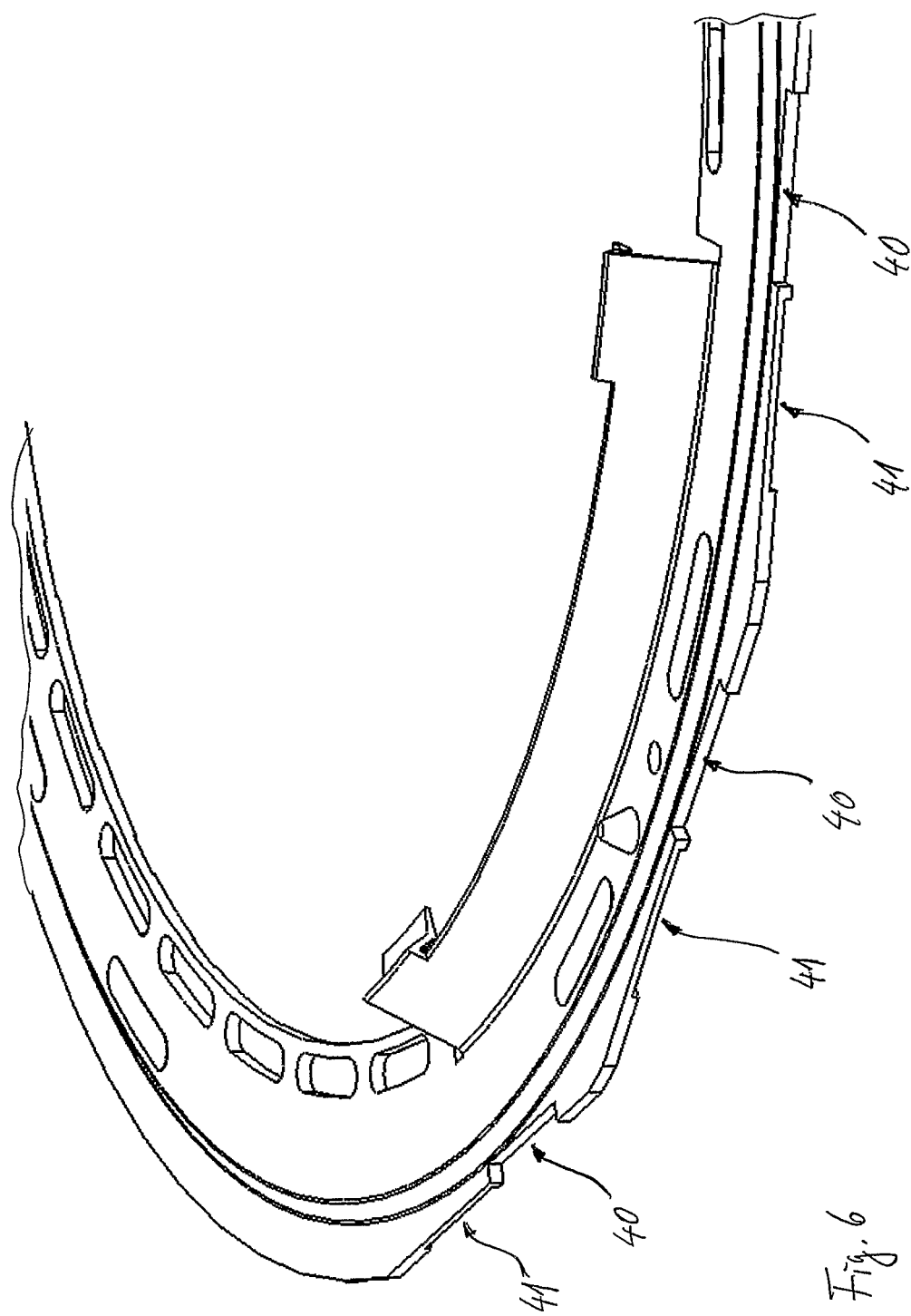
FIG. 6 is a partial view of a storage ring from FIGS. 4 and 5.
Figure 7:
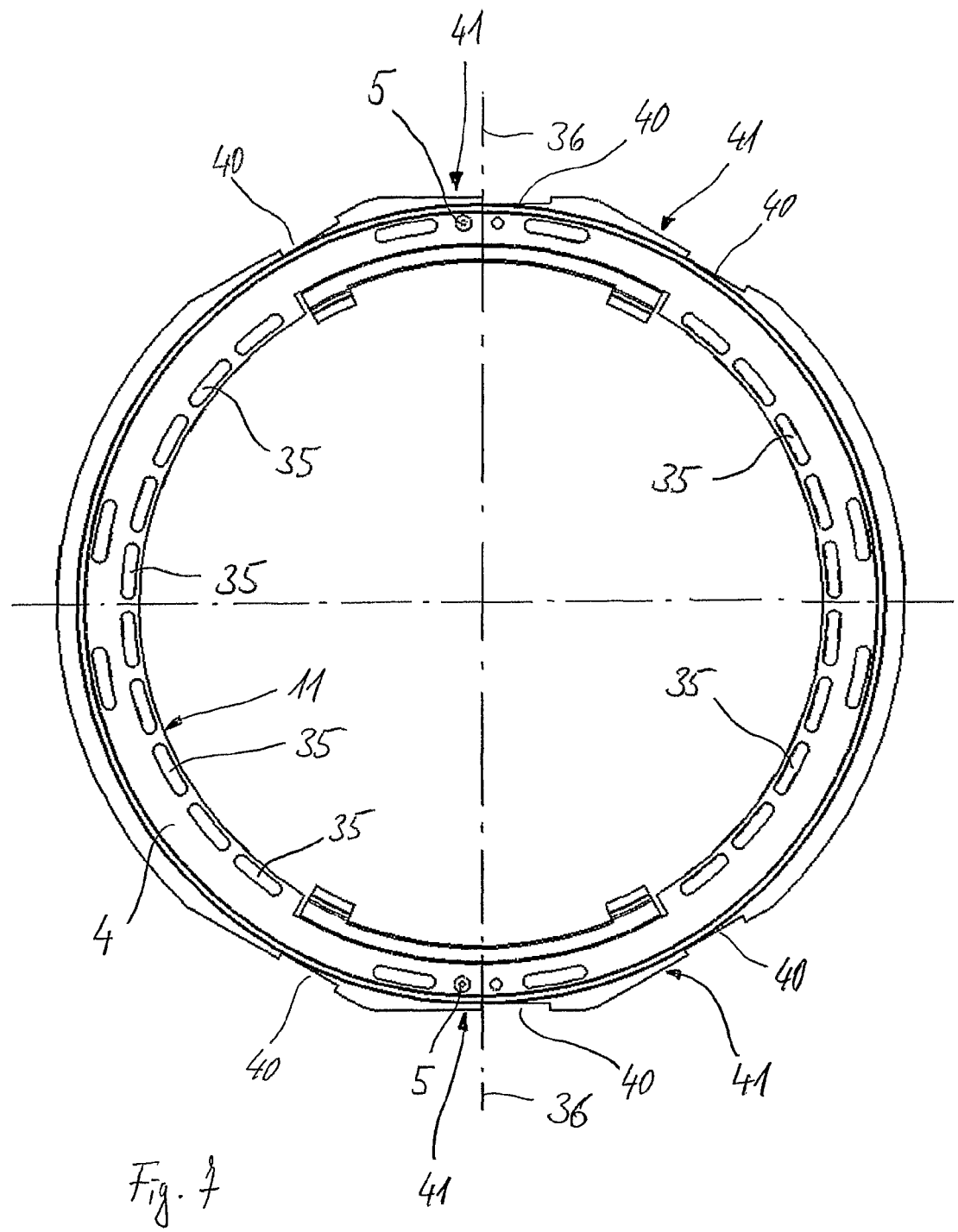
FIG. 7 is a top view of one of the storage rings from FIG. 6.

In addition, on its circumference at diametrically opposite locations, each storage ring 1 has three sections with a downwardly and upwardly open notch 40 and three sections with a downwardly open flat spot 41. In this case, two different sections 40, 41 are arranged immediately adjacently to one another. With reference to a diameter line, the two sections with the notch 40 lie on the same side of the respective diameter line in a storage ring. The same applies to the sections with the downwardly open flat spot 41. In this case, the sections 40, 41 are arranged so that when successive storage rings are each rotationally offset by 180°, on both sides of the stack and in each case on both sides of the diameter line sections having a downwardly open flat spot 41 always come to lie directly above a section having a notch 40 and conversely. As a result, two storage rings arranged one above the other, for example, storage rings 1c, 1d each form a pocket 45 on both sides of the stack 3 but on different sides of the diameter line (or the diameter plane formed from diameter lines). In addition, in relation to respectively the same side of the stack 3, the lower storage ring 1c of these two storage rings with the next lower storage ring 1d and the upper 1c of the two storage rings with the respectively next higher storage ring 1e each form another pocket 45 but located on the other side of the diameter line. As a result, rows 46a, 46b with pockets 45 are formed on both sides of the stack in the vertical direction, each alternatively to the left and right of the diameter plane (FIG. 5).

This exemplary embodiment has substantially identical opening means on both sides of the stack of which only the opening device 15 of one side is shows in FIGS. 8a to 8d. As in the embodiments according to the invention which have already been described, the opening devices 15 are also pivotally (not shown in detail) mounted in this one so that the opening devices can be pivoted to and from the stack 3 at the side.

The opening device are each provided with a cylinder 47 which has a piston rod 48 which can be extended vertically parallel to the stacking axis. Affixed to the piston rid 48 is a lower engaging part 49 which is provided with an engaging finger 50 pointing towards the stack. A sleeve 51 which can be moved in the axial direction relative to the piston rod 48 is pushed on the piston rod via the lower engaging part 49. At both its axial ends the sleeve 51 is provided with a disk-shaped front face 51a, 51b. An engaging finger pointing towards the stack 3 is formed on the lower disk-shaped front face 51b.

An upper engaging part 53 comprising a total of five superposed engaging fingers 54 is located on the sleeve 51 between the two front faces 51a, 51b. In this case, the distance between successive fingers 54 corresponds to the distance which successive pockets 45 (FIG. 5) of the storage rings 1 have to one another. The same applies to the distance between the engaging finger 50 of the lower engaging part 49 in the position shown in FIG. 10a and the lowermost engaging finger 54 of the upper engaging part 53. The upper engaging part 53 is fixed with respect to the support of the opening means not shown in detail here.

Located between the upper engaging part 53 and the sleeve is a compression spring 55 which loads the upper engaging part 53 with a compressive force in the direction of the upper disk-shaped front face 48a of the sleeve 51 or the sleeve 51 in the direction of the lower engaging part 49. The upper engaging part 53 is additionally firmly connected to a locking means whose catch 56 is located on a piston 58 which can be displaced transversely to the stacking axis 6 and against the force of a compression spring 57. Both the upper engaging part 53 and the locking means are arranged rigidly with respect to the support 19. The catch 56 can be driven below the upper disk-shaped front face 48a of the sleeve 51, thereby fixing the axial position of the sleeve 51.

As cannot be identified in the schematic diagrams in FIGS. 11a-c but is shown in FIG. 10, the aforesaid elements, lower engaging part 49, sleeve 51 and upper engaging part 53 are provided twice on each opening device these being offset by about 30° with respect to one another on the circumference of the stack. The fingers 54 of the upper engaging part are obtained in this case by respectively two engaging partial elements 53a, 53b arranged adjacent to one another in the circumferential direction of the storage rings. Fingers 54 of one engaging partial element 53a are each offset with respect to one another by the distance that the pockets 45 of one row 46a or 46b have with respect to one another (FIG. 5). The same applies to the fingers 54 of the other engaging partial element 53b. Since the fingers 54 of the two engaging partial elements 53a, 53b are additionally offset in relation to the stacking axis (Z direction) by in each case half the distance between successive pockets 45, the engaging partial element 53a engages respectively following pockets 45 of the one row 46a. The fingers 54 of the other engaging partial element 53b engage in adjacently located pockets 45 of the other row 46b which are offset by half the pocket spacing in the Z direction (FIG. 5 and FIG. 10)

Two different access methods can be executed with this device whereby either an even or an odd storage ring can be made available for access relative to the position in the stack. In the first method the sleeve 51 is locked on the upper engaging part 53 by means of the catch. In both methods, for an exposure the base plate 13 with the storage rings is initially moved to a particular Z position along the stacking axis whereby the lower engaging part 49 is located opposite a certain pocket 45. This is a pocket 45' which is delimited at the bottom by the storage ring 1' which is to be made available. This situation is reproduced in FIG. 8a.

The opening means is then pivoted towards the stack 3 whereby the engaging finger 50 of the lower engaging part 49 engages in said pocket 45'. The engaging fingers 54 of the upper engaging part 53 hereby enter into the five pockets 45 located vertically immediately above the said pocket 45. This is shown in FIG. 8b.

The piston rod 48 is then retracted until the stop 48a of the piston rod 48 impinges upon the upper disk-shaped front face 51a of the sleeve 51. Simultaneously with this movement, the base plate 13 is lowered further where the distance covered by the base plate 13 is greater than the distance covered by the lower engaging element 49.

As shown in FIG. 8c, as a result of these movements the storage ring 1' to be made available is displaced as the uppermost storage element of a lowered part 3a of the stack. As a result of the stop 48a of the piston rod 48 impinging upon the upper front face 51, a predetermined distance is created between the storage ring 1' to be made available and the upper stack part 3b held by the upper engaging part. As a result of the larger distance covered by the base plate 13 compared to the lower engaging part 49, a distance of predetermined magnitude is additionally created between the storage ring 1' to be made available and next storage ring 1'' downwards. By this means sufficient space is available to move the usual gripper below the wafer of the storage ring 1' which has been made available, to raise the wafer and then remove it from the stack. The stack can then be closed again following access to a particular storage ring by an upward displacement movement of the base plate 13.

In the second access method shown in FIGS. 12a-c, a storage ring 1''' is to be made available, this being located at an odd position in the stack 3, for example, at the 11$^{th}$ position starting from the base plate 13, for this purpose the stack is also moved into a specific position relative to the lower engaging element 49, i.e. the position shown in FIG. 12a. Then, according to the diagram in FIG. 12a, the opening devices 15 are pivoted onto the stack. In this case, the sleeve 51 is still locked by the catch 56. As a result of this movement, the engaging finger 50 of the lower engaging part 49 is located in the next lower pocket 45' following the storage ring to be made available.

The piston rod 48 now begins the withdrawal movement and the base plate 13 is lowered as shown in FIG. 12b. In addition, the catch 56 is pulled back, unlocking the sleeve 51 with respect to the upper engaging element 53. During the following further withdrawal movement of the piston rod, the compression spring 55 presses the sleeve 51 downwards whilst the upper engaging element 53 retains its position as a result of its rigid connection to the support of the opening device. The movement of the sleeve 51 is stopped as soon as the upper front face 51a of the sleeve 51 hits against the upper engaging element 53. The storage ring 1''' is hereby made available with respect to the storage rings located above it, as shown in FIG. 12c.

Through the withdrawal movement of the piston rod 48 and the simultaneous displacement movement of the base plate 13, the stack part 3a located underneath the storage ring to be made available is removed downwards from said storage ring 1'''. This takes place merely as a result of the weight of the storage rings located in this stack part.

The storage ring 1''' to be made available is held by the engaging finger 52 of the sleeve 51. Since the magnitude of the relative movement between the upper engaging element 53 and the sleeve 51 is smaller than the distance covered by the lower engaging element 49 or the base plate 13, said storage ring 1''' is also made available for access with respect to all the storage rings located below it in the stack. Here also the stack can be closed again by an upward movement of the base plate, where the latter enters by itself into its locking position in the sleeve as a result of a slope 56a of the catch.

In all the embodiments of the invention, instead of a horizontal alignment of the storage rings and wafers, a substantially vertical alignment could also be provided.

REFERENCE LIST

1 Storage ring
2 Stacking area
3 Stack
4 Ring part
5 Centring elements
6 Stacking axis
7 Storage area
8 Wafer
9 Holding element
9a First section
9b Second section
10 Bearing surface
11 Inner circumferential surface
12 Cover plate
12a Recess
13a Connection
13 Base plate
15 Opening device
16 Holding element
17 Holding element
18 Holding element
19 Support
20 Pivot axis 21 Groove
24 Separating element
25 Separating element
26 Groove
27 Carriage
28 Light transmitter
29 Light beam
30 Light receiver
32 Region
33 Sealing area
34 Channel area
35 Oblong-hole-shaped recess
36 Diameter line
27 Webs
38 Channel
38a Gap
40 Notch
41 Flat spot
42 Section
43 Notch
45 Pocket
46a Row
46b Row
47 Cylinder
48 Piston rod
48a Stop
49 Lower engaging part
50 Engaging finger
51 Sleeve
51a Front face
51b Front face
52 Engaging finger
53 Upper engaging part
53a Engaging partial element
53b Engaging partial element
54 Engaging finger
55 Compression spring
56 Catch
56a Slope
57 Compression spring
58 Piston

The invention claimed is:

1. A device for storing plate-shaped substrates, wafers or test wafers including those used for manufacturing electronic components, the device comprising:
a plurality of storage elements which follow one another in a stacking direction and are movable relative to one another, each provided for receiving at least one substrate, the storage elements are each provided with a means for supporting the substrates, the storage elements have a stacking area which is provided for placing the respective storage elements inside a stack of storage elements and at least some of the storage elements are configured as substantially the same, wherein compensation is provided to compensate for stacking errors, wherein compensation is provided for a deviation of at least one storage element from a desired position in relation to a direction transverse to the stacking axis.

2. The device according to claim 1, wherein compensation is provided for a deviation of at least one storage element from a desired position in relation to a stacking axis in the stacking direction.

3. The device according to claim 1, further comprising:
an opening means whereby a distance between two storage elements arranged in a stack of storage elements can be varied;
a detection means whereby information on positions of individual storage elements in the stack can be determined;
a controller to which the position information can be supplied and which, taking into account the position information, can generate control signals by which means the opening means and the stack can be moved relative to one another and positioned relative to one another in a desired position.

4. The device according to claim 3, wherein the position information is provided for generating a displacement movement of the stack in the stacking direction.

5. The device according to claim 3, wherein the position information is provided for generating a displacement movement of the opening means.

6. The device according to claim 3, wherein the opening means is provided with at least two opening devices which are offset with respect to one another in the circumferential direction of the stack, which are provided for substantially simultaneous contact with one of the storage elements, wherein the at least two opening devices are displaceable independently of one another in the direction of stacking.

7. The device according to claim 6, wherein the at least two opening devices are displaceable both jointly and independently of one another.

8. The device according to claim 6, further comprising:
two detection means of which each detection means is assigned to one other of the at least two opening devices, both detection means are provided to determine position information of storage elements, wherein position information of the detection means is provided for generating relative displacement movements between the opening devices.

9. The device according to claim 3, wherein at least two storage elements placed one upon the other jointly form at least one handling aid for the opening means.

10. The device according to claim 9, wherein storage elements stacked one upon the other at least form two substantially adjacently arranged rows of handling aids.

11. The device according to claim 10, wherein the handling aids of the two rows are offset in the direction of the stacking axis by half the spacing of successive handling aids in one of the rows.

12. The device according to claim 10, wherein the handling aids are formed as engagement pockets.

13. A device for storing plate-shaped substrates, wafers or test wafers including those used for manufacturing electronic components, the device comprising:
a plurality of storage elements which follow one another in a stacking direction and are movable relative to one another, each provided for receiving at least one substrate, the storage elements are each provided with a means for supporting the substrates, the storage elements have a stacking area which is provided for placing the respective storage elements inside a stack of storage elements and at least some of the storage elements are configured as substantially the same, wherein compensation is provided to compensate for stacking errors, wherein the storage elements are arranged rotationally offset with respect to one another in relation to their circumferential direction such that the rotationally offset storage element compensate for stacking errors.

14. The device according to claim 13, wherein three or more storage elements arranged one after the other in the stack, successive storage elements are arranged rotationally offset with respect to one another in relation to a stacking axis, wherein the first or the last of these successive three or more storage elements are located in at least substantially the same rotational position.

15. The device according to claim 13, wherein a plurality of successive storage elements are rotationally offset with respect to one another by the same angular amount.

16. The device according to claim 15, wherein three or more successive storage elements are rotationally offset with respect to one another by the same angular amount.

17. A device for storing plate-shaped substrates, wafers or test wafers including those used for manufacturing electronic components, the device comprising:
a plurality of storage elements which follow one another in a stacking direction and are movable relative to one another, each provided for receiving at least one substrate, the storage elements are each provided with a means for supporting the substrates, the storage elements having a stacking area which is provided for placing the respective storage elements inside a stack of storage elements and at least some of the storage elements are configured as substantially the same;
a means for introducing a medium into the stack;
a gas conducting means arranged in the stack, said gas conducting means being arranged on said storage elements.

18. The device according to claim 17, wherein a channel is arranged in the stack, said channel extending at least substantially over the entire height of the stack, said stack being aligned at least substantially parallel to the stack axis.

19. The device according to claim 18, wherein at least one stacking aid is provided on one of the storage elements, wherein the distance of the at least one stacking aid of a storage element is greater than the distance from the stacking axis of a seal pertaining to respectively the same storage element.

20. The device according to claim 17, wherein said gas conducting means includes at least one gas conducting element through which the medium can be passed into an area provided for the placement of substrates.

21. The device according to claim 20, wherein said at least one gas conducting element of the gas conducting means is formed by storage elements and by seals, one of said seals being provided between respectively two storage elements which follow one another in the stack, wherein the distance of the at least one gas conducting element from the stack axis is less than the distance of at least one of the seals from the stack axis.

22. The device according to claim 21, wherein the seals are formed from the storage elements themselves.

23. The device according to claim 22, wherein one of the seals respectively comprises webs of successive storage elements.

24. The device according to claim 20, wherein said at least one gas conducting element is configured as a channel obtained through recesses of storage elements stacked one upon the other.

25. A method for storing plate-shaped substrates, wafers or test wafers including those used for manufacturing electronic components, the method comprising the steps of:
arranging separable storage elements one after the other in a stacking direction;
placing a substrate on supporting means of one of the storage elements;
varying a spacing between storage elements by a means of an opening means;
obtaining information on positions of individual storage elements in the stack via a detection means;
transferring the position information a controller;
producing a relative movement between the stack and the opening means based on the position information such that the opening means is positioned in a predetermined position with respect to one of the storage elements.

26. The method according to claim 25, wherein position information of storage elements is determined independently of one another by at least two detection means, this position information is fed to the controller which triggers displacement movements taking into account the position information, by which means the two opening devices can be positioned independently of one another in relation to the stack axis to produce a spacing between one particular storage element and an adjacent storage element in the stack.

27. A device for storing plate-shaped substrates, wafers or test wafers those used for manufacturing electronic components, the device comprising:
a plurality of storage elements which follow one another in a stacking direction and are movable relative to one another, each provided for receiving at least one substrate, the storage elements are each provided with a means for supporting the substrates, the storage elements having a stacking area which is provided for placing the respective storage elements inside a stack of storage elements and at least some of the storage elements are configured as substantially the same, said storage elements being arranged rotationally offset with respect to one another in relation to their circumferential direction such that the rotationally offset storage element compensate for stacking errors;
a means for introducing a medium into the stack;
a gas conducting means arranged in the stack.

28. A device for storing plate-shaped substrates, wafers or test wafers including those used for manufacturing electronic components, the device comprising:
a plurality of storage elements which follow one another in a stacking direction and are movable relative to one another, each provided for receiving at least one substrate, the storage elements are each provided with means for supporting the substrates, the storage elements having a stacking area which is provided for placing the respective storage elements inside a stack of storage elements and preferably at least some of the storage elements are configured as substantially the same, said storage elements being arranged rotationally offset with respect to one another in relation to their circumferential direction such that the rotationally offset storage element compensate for stacking errors;
a means for introducing a medium into the stack;
a gas conducting means arranged in the stack, said gas conducting means including at least one gas conducting element through which the medium can be passed into an area provided for the placement of substrates.

* * * * *